United States Patent [19]

Morioka et al.

[11] Patent Number: 4,911,780
[45] Date of Patent: Mar. 27, 1990

[54] LEC METHOD FOR GROWING A SINGLE CRYSTAL OF COMPOUND SEMICONDUCTORS

[75] Inventors: Mikio Morioka; Atsushi Shimizu, both of Hyogo, Japan

[73] Assignee: Sumitomo Electric Industries, Ltd., Osaka, Japan

[21] Appl. No.: 684,727

[22] Filed: Dec. 21, 1984

[30] Foreign Application Priority Data

Dec. 24, 1983 [JP] Japan .................. 58-248971

[51] Int. Cl.$^4$ ............... C30B 15/04; C30B 29/40; C30B 29/48; C30B 35/00
[52] U.S. Cl. .................. 156/605; 156/617.1; 156/620.2; 156/DIG. 70; 422/245; 422/249
[58] Field of Search ......... 156/605, 607, 608, 617 SP, 156/601, DIG. 70; 422/249, 245

[56] References Cited

U.S. PATENT DOCUMENTS

| | | | |
|---|---|---|---|
| 3,759,671 | 9/1973 | Bleil | 156/608 |
| 4,246,064 | 1/1981 | Dewees et al. | 156/608 |
| 4,303,464 | 1/1981 | Suzuki et al. | 156/607 |
| 4,329,195 | 5/1982 | Kudo | 156/617 SP |

FOREIGN PATENT DOCUMENTS

248971 12/1983 Japan .

*Primary Examiner*—Gary P. Straub
*Attorney, Agent, or Firm*—Cushman, Darby & Cushman

[57] ABSTRACT

If the distribution coefficient of an impurity in a compound melt is less than 1, the impurity concentration in the compound melt doped with the impurity increased during a crystal growth in an LEC method. A supplying device replenishes an undoped crystal into the melt in order to keep the impurity concentration constant. The undoped crystal is covered with a liquid encapsulant which is contained in an encapsulant-supporting-cylinder or double-cylinder. Replenishing rate (dQ/dt) of the undoped crystal and the growing rate (dS/dt) should satisfy the equation $$dQ/dt = (1-k)dS/dt$$

The impurity concentration of a grown single crystal is uniform. Whole of the crystal is a single crystal. Electronic properties of the single crystal is uniform from seed end to tail end.

9 Claims, 2 Drawing Sheets

LEC METHOD FOR GROWING A SINGLE CRYSTAL OF COMPOUND SEMICONDUCTORS

BACKGROUND OF THE INVENTION

This invention relates to an improvement of a liquid encapsulated Czockralski method (LEC method) for growing a single crystal of compound semiconductors.

In growing a single crystal of compound semiconductors, various kinds of elements are usually doped in order to change electronic characteristics or to reduce the dislocation density of the single crystal.

For example, some elements which have a different valence number from that of matrix elements of the semiconductor crystal are doped as impurity in order to make the grown crystal into an n-type semiconductor or a p-type semiconductor.

In this invention compound semiconductors mean semiconductors of groups III-V and groups II-VI in the periodic table.

For example GaAs, GaP, InP, GaSb, etc are semiconductors of groups III-V. CdS, CdSe, CdTe, etc are semiconductors of groups II-VI.

For example in the case of growing a single crystal of GaAs, isoelectronic impurities—B, In, Sb, etc—are doped in order to reduce the dislocation density in the single crystal. Isoelectronic impurity is defined as an impurity whose valence number is the same with one of the matrix elements of semiconductor crystals.

Besides, S, Te, Si, etc which are not isoelectronic impurities are doped into GaAs single crystals to change electronic characteristics.

A liquid encapsulated Czockralski method (LEC method) is one of the prevailing methods used to grow a single crystal of semiconductor.

An LEC method comprises: melting encapsulant material and compound material into a compound melt covered with a liquid encapsulant in a crucible by heating, dipping a seed crystal into the compound melt, growing a single crystal from the compound melt by pulling up and rotating the seed crystal and cooling the grown crystal in a cooling zone above the crucible.

In the case of doping some impurities, the impurities ae added into the compound material as elements or compound which comprise the impurity elements.

When a single crystal is grown from a compound melt which includes an impurity element, the impurity concentration $C_s$ in a solidified single crystal pulled up is not equal to the impurity concentration $C_L$ in the compound melt in general.

The boundary between a compound melt and a solidified single crystal is called a liquid-solid interface. Generally the ratio of the impurity concentrations of a solidified part to that of a melt is a constant value, which is called a distribution coefficient.

The distribution coefficient depends upon a pressure acting on the melt and a ratio of elements of matrix compound in the melt. But if the pressure is kept constant, the distribution coefficient is constant in the crystal growth.

The distribution coefficient k is defined by $$k = C_s/C_L \tag{1}$$

If the impurity concentration is 1 in a melt, the impurity concentration of the solidified part at the liquid-solid interface is k.

Distribution coefficients are defined by determining an impurity element and a matrix melt. They obtain various values according to the impurity element and the matrix melt. When the impurity element and the matrix melt are identified, the distribution coefficient changes as a function of pressure.

But in many cases the distribution coefficient is smaller than 1. If the impurity has a distribution coefficient smaller than 1, impurity atoms do not easily penetrate into the solidified part. When a single crystal is pulled up from a compound melt including an impurity element by an LEC method, the compound elements of the matrix of the crystal are removed from the crucible more rapidly than the impurity element. Then the impurity concentration in the melt gradually increases during the crystal growth.

The impurity concentration C in a crystal grown by an LEC method is given by $$C = C_0 k (1-g)^{k-1} \tag{2}$$

Where $C_0$ is an initial impurity concentration in the compound melt and g is a ratio of solidified part to the initial compound melt by weight. This ratio is called solidification ratio from now for simplicity.

At the initial state the solidification ratio g is zero. During the crystal growth the solidification rate g increases.

If the distribution coefficient k is smaller than 1, the impurity concentration C is lowest at the beginning of the crystal growth, because the solidification rate g is zero. And the impurity concentration C raises as the crystal growth proceeds. When the solidification rate g comes near to 1, the impurity concentration diverges.

Accordingly if the impurity having a distribution coefficient k less than 1 is doped in a compound melt, the impurity concentration C is lowest at a seed end of a single crystal grown from the melt and is highest at a tail end of the crystal.

A single crystal ingot grown by the LEC method is sliced in the planes which are perpendicular to the growth axis. Sliced crystals are called wafers. According to the explanation abovementioned, the impurity concentration is different with regard to each wafer sliced from the same crystal ingot. Therefore it is difficult to make many wafers having the same characteristics by the LEC method.

Furthermore when the impurity concentration in the initial melt is very high, the impurity concentration in the melt raises higher than a limit of single-crystallization. Separating of impurity atoms on the surface of the pulled crystal happens. After the separating occurs, the solidified part does not become a single crystal. Therefore, only a small upper portion of the ingot is available, because a semiconductor wafer must be a single crystal.

It is desirable that the grown ingot should be a single crystal from seed end to tail end and the impurity concentration should be uniform in the single crystal.

If a great amount of compound melt which is many times larger than the crystal to be grown are contained in a big crucible, the change of the impurity concentration during the crystal growth might be trivial.

But in the practical case the diameter of a crucible is determined to be twice as big as the diameter of the single crystal grown from the crucible, and the depth of the crucible is nearly equal to the diameter of the crystal. Thus it is impossible to use excessively much compound melt.

SUMMARY OF THE INVENTION

An object of the invention is to provide an LEC method and apparatus for growing a single crystal of compound semiconductors wherein the whole of the grown crystal is single and the impurity concentration is uniform from seed end to tail end of the single crystal.

The LEC apparatus of this invention has a device for supplying compound material into the melt to keep the impurity concentration constant in the melt during the crystal growth. The supplying device holds an undoped polycrystal or single crystal of compound material and dips little by little the compound material into the melt. The replenished material compensates for the decrease of the material removed by the grown crystal.

Mathematical consideration will clarify the features of the invention.

"L" denotes a weight of compound melt. "S" denotes a weight of the single crystal grown from the compound melt. "Q" denotes a weight of a polycrystal or single crystal replenished into the melt by the supplying device. And "m" denotes a weight of an impurity in the compound melt.

The following equations hold. When the single crystal is pulled more by an infinitesimal weight dS and the impurity in the compound melt decreases by an infinitesimal weight (−dm); the decrement (−dm) is given by $$-dm = kCdS \quad (3)$$

because CdS is the weight of impurity included in the infinitesimal part dS of the melt and kCdS is the weight of impurity included in the infinitesimal part dS of the crystal pulled from the melt.

The sum of the increment of the weight of the crystal and the increment of the weight of the melt must be zero, if the compound material is not replenished like conventional LEC methods. However, the apparatus of the invention replenishes compound material into the melt. Then the sum of the increments of the weights of the melt and the crystal must be the replenished amount of the compound material. Thus we obtain $$dS + dL = dQ \quad (4)$$

The impurity weight m in the melt must be equal to the product of the melt weight L and the impurity concentration C in the melt. Hence, $$CL = m \quad (5)$$

Eq.(3), Eq.(4), and Eq. (5) are fundamental equations.

If we assume the impurity concentration C should be constant during a crystal growth, the infinitesimal increment dC is zero. By differentiating Eq.(5) and substituting Eq.(3) and Eq.(4) into the differential equation, we obtain $$dQ = (1-k)dS \quad (6)$$

$$dL = -kdS \quad (7)$$

$$dm = -kCdS \quad (8)$$

Eq.(6) is an important equation for this invention. From Eq.(6) when the crystal is pulled more by dS, the replenishment of polycrystal or single crystal by (1−k)dS will keep the impurity concentration constant.

In the case of the compound semiconductor of group III-V, the elements of group V are apt to escape from the polycrystal or single crystal to be replenished in the melt. To prevent this phenomenon, a liquid encapsulation should be required.

The liquid encapsulant should be $B_2O_3$ in the case of the crystal growth of GaAs. The density of the $B_2O_3$ is considerably smaller than that of GaAs. Then the liquid encapsulant $B_2O_3$ can cover a polycrystal or single crystal of GaAs up to a definite level much higher than the liquid-solid interface in the crucible.

DETAILED DESCRIPTION OF THE PREFERRED EMBODIMENTS

Figure 1:
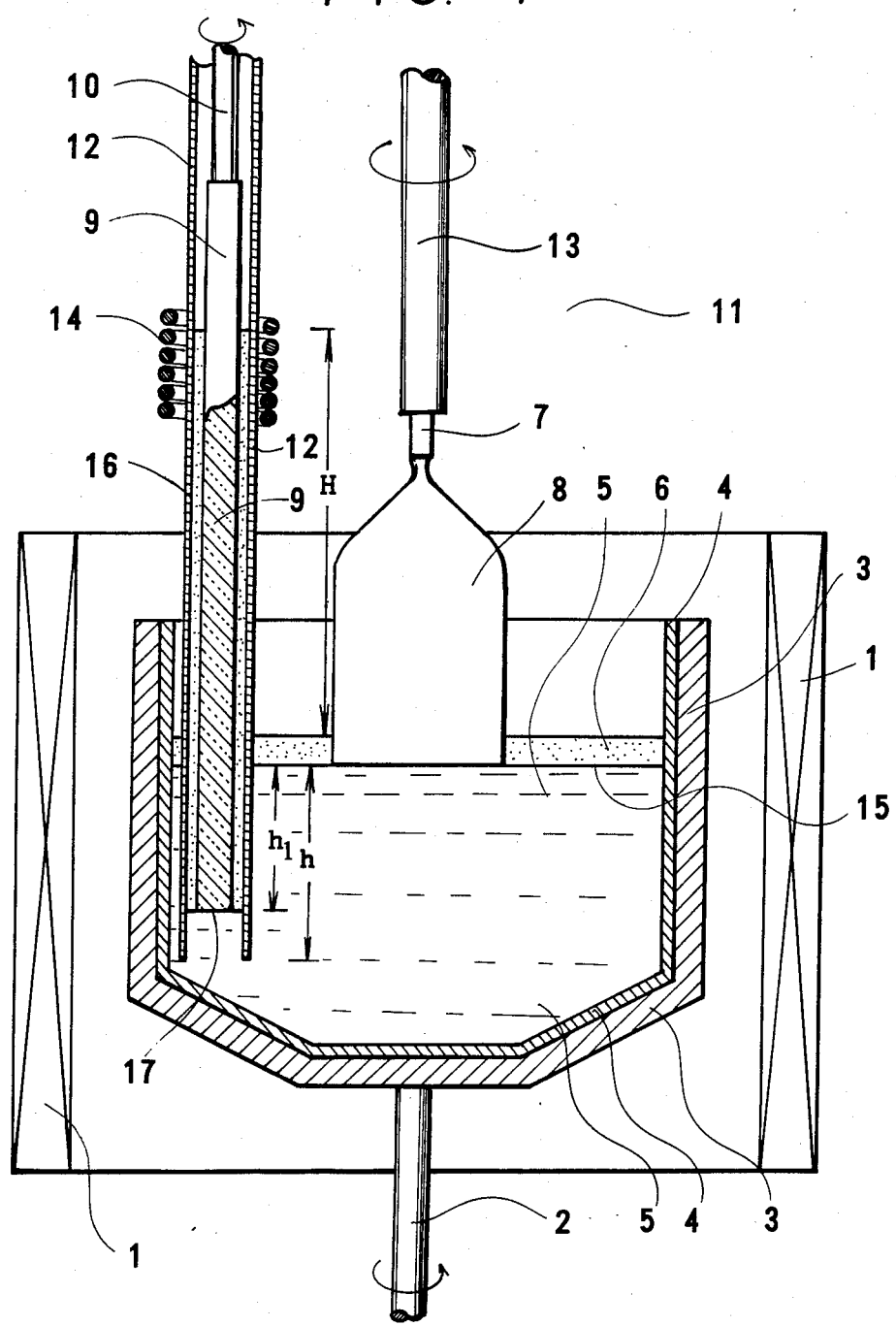
FIG. 1 is a sectional view of an LEC apparatus for growing a single crystal of compound semiconductors according to a first embodiment of the invention.

In FIG. 1 a heater (1) is a cylindrical resistance heater. A lower shaft (2) is a vertical shaft which can rotate and move upward or downward. A susceptor (3) is supported at the top end of the lower shaft (2). A crucible (4) is inserted into the susceptor (3). The crucible (4) is made from quartz, PBN (pyrolytic boron nitride), etc.

There is a compound melt (5) in the crucible (4). The compound melt (5) keeps a liquid state, because it is heated by the heater (1). The compound melt (5) consists of pure material of matrix compound and some impurities.

A liquid encapsulant (6) covers on the upper surface of the compound melt (5). The liquid encapsulant (6) prevents an element of group V with a high dissolution pressure from escaping out of the crystal.

If the compound melt is GaAs, a most preferable liquid encapsulant is $B_2O_3$. If the compound melt is GaSb, a most preferable liquid encapsulant is an eutectic of KCl and NaCl.

These members are contained in a pressurized chamber in which nitrogen gas or inert gas (Ar, He, etc) is filled at a high pressure. The pressurized chamber is not shown in the figures for simplicity.

From an upper region of the pressurized chamber an upper shaft (13) is retained along a vertical line.

A seed crystal (7) is fixed to the bottom end of the upper shaft (13). The upper shaft (13) can rotate and move upward or downward arbitrarily.

By dipping the seed crystal (7) into the compound melt (5) and pulling up the seed crystal (7) with a certain rotation speed, a single crystal (8) is pulling up, succeeding to the seed crystal (7).

The structure mentioned so far is the same with that of the conventional LEC apparatus.

Besides these members the LEC apparatus of this invention has a device for supplying compound material little by little into the melt (5) to keep the impurity concentration constant. This is an important characteristic of the invention.

The compound material to be replenished is either an undoped polycrystal or single crystal of the compound semiconductor to be grown. Then the material to be replenished is called an "undoped crystal" in common.

In the embodiment shown in FIG. 1 an undoped crystal (9) is formed in a long, round stick. The upper end of the undoped crystal (9) is supported by a supplying shaft (10) which can rotate and move upward or downward.

Bottom end (17) of the undoped crystal (9) contacts with the compound melt (5) and is melted little by little by the heat transmitted from the melt (5). Molten material dissolves in and mixes with the melt (5).

Because compound material is replenished into the melt (5), the impurity is diluted by the newly-replenished material of matrix compound. To dilute the impurity uniformly, the crucible (4) and the single crystal (8) are rotated. The rotational motion helps the impurity mix with the matrix material.

By controlling the speed of dipping of the undoped crystal (9) into the melt (5), we can suppress the increase of the impurity concentration, keep the impurity concentration constant or reduce it also.

The undoped crystal must be covered by a pertinent liquid encapsulant to prevent the element of group V from escaping out of the undoped crystal. A cylinder (12) is suspended from a sustaining device (not shown in the figures) above the crucible. The cylinder (12) encloses the undoped crystal (9). Between the pillared undoped crystal (9) and the inner surface of the cylinder (12) a liquid encapsulant (16) is filled.

The liquid encapsulant (16) covers greater part of the undoped crystal (9) from the bottom end. Thus the cylinder (12) is called an encapsulant-supporting cylinder.

The element of group V is apt to escape from the compound crystal of groups III-V only when the crystal is heated up to a high temperature. The pillared undoped crystal (9) is hottest at the bottom end. Thus the liquid encapsulant (16) must cover the lower half of the pillared undoped crystal (9).

In the case of the crystal growth of GaAs, the liquid encapsulant (16) is $B_2O_3$. $B_2O_3$ is solid at a room temperature. $B_2O_3$ is melted into liquid by heating it at about 500° C. to 600° C. Fortunately at 500° C. to 600° C. As dose not escape from a GaAs crystal.

Then a local heater (14) is installed n the middle region of the encapsulant-supporting-cylinder (12) in order to heat the upper portion of the liquid encapsulant (16). The heater (14) melts the encapsulant material into a liquid state. Whole encapsulant material keeps a liquid state by the heat generated at the main heater (1) and the local heater (14). Thus the local heater (14) is called an encapsulant-heater.

Because the encapsulant is liquid throughout the full length, and because the upper surface of the liquid encapsulant is pressurized by nitrogen gas at a high pressure, the liquid encapsulant effectively prevents As from escaping out of the strongly-heated bottom region of the undoped GaAs crystal.

The speed for supplying the undoped crystal (9) into the compound melt (5) determines the variation of the impurity concentration in the compound melt (5).

In order to keep the impurity concentration constant, the supplying speed of the undoped crystal is given by $$dQ/dt = (1-k)dS/dt \qquad (9)$$

according to Eq.(6). Here dQ/dt means the supplying speed. It is a weight of undoped crystal which is supplied into the melt in a unit time. dS/dt means a speed of the crystal growth. It is a weight increment of the growing crystal in a unit time.

Now more specialized case is considered to use more measurable parameters. We assume the single crystal (8) has a round section with a radius E and the undoped crystal (9) has a round section with a radius F. "U*" denotes a relative line velocity for pulling the single crystal (8) with regard to a liquid-solid interface (15). "V*" denotes a relative line velocity for dipping the undoped crystal (9) with regard to a liquid-solid interface (17). The ascending velocity U* and the descending velocity V* must satisfy the equation $$F^2 V^* = (1-k)E^2 U^* \qquad (10)$$

in order to keep the impurity concentration constant.

Strictly speaking the liquid-solid interfaces (15) and (17) move upward or downward by vertical displacements of the lower shaft (2) and the upper shaft (13). "W" is an ascending velocity of the lower shaft. Because W is the ascending velocity, W is negative when the lower shaft is descending. "U" is an ascending velocity of the upper shaft (13). This is not a relative velocity but an absolute velocity. U is not identical to U* in Eq.(10). "V" is a descending velocity of the supporting shaft (10). This is not a relative velocity. V is not identical to V* in Eq.(10). "A" is an area of the liquid-solid interface (15). "B" is a sectional area of the single crystal (8). "C" is a sectional area of the undoped crystal (9) to be replenished.

The condition for keeping the impurity concentration constant in the compound melt (5) is given by $$\frac{CV - (1-k)BU}{C + (1-k)B} = -\frac{AW - kBU}{A - kB} \qquad (11)$$

When Eq.(9) is not rigorously satisfied, the impurity concentration will vary. The rate of variation is calculated from $$dC/CL = (1-k)dS - dQ \qquad (12)$$

In Eq.(12) dS and dQ are independent variables. From Eq.(12) when the melt weight L is large enough, even if the variables dS and dQ deviate a little from Eq.(9), the variation of the impurity concentration C is very small.

An example which satisfies the special equation (10) is now explained.

In this example the relative pulling velocity of the single crystal (8) is 5 mm/H, the diameter of the single crystal (8) is 50 mm, and the diameter of the undoped crystal (9) to be replenished is 15 mm. Then from Eq.(10) the most pertinent relative velocity of the undoped crystal dipping into the melt should be $$(1-k) \times 55.6 \text{ (mm/H)}$$

In the example shown in FIG. 1 the undoped crystal (9) is a pillar. And it is enclosed by the encapsulant-supporting-cylinder (12). The supplying device comprises the supplying shaft (10), the cylinder (12) and the supporting device (not shown in FIG. 1) which rotates and suspends the supplying shaft (10). In the disposition the cylinder (12) dips into the melt (5) at the peripheral region of the crucible (4).

This disposition of the cylinder breaks a rotational-symmetry of the melt.

The crucible (4), the susceptor (3), the lower shaft (2) and the melt (5) rotate in the crystal growth. The non-symmetric disposition of the cylinder may make a perturbation on the liquid-solid interface (15). The perturbation may hinder the cylindrical growth of a crystal.

Figure 2:
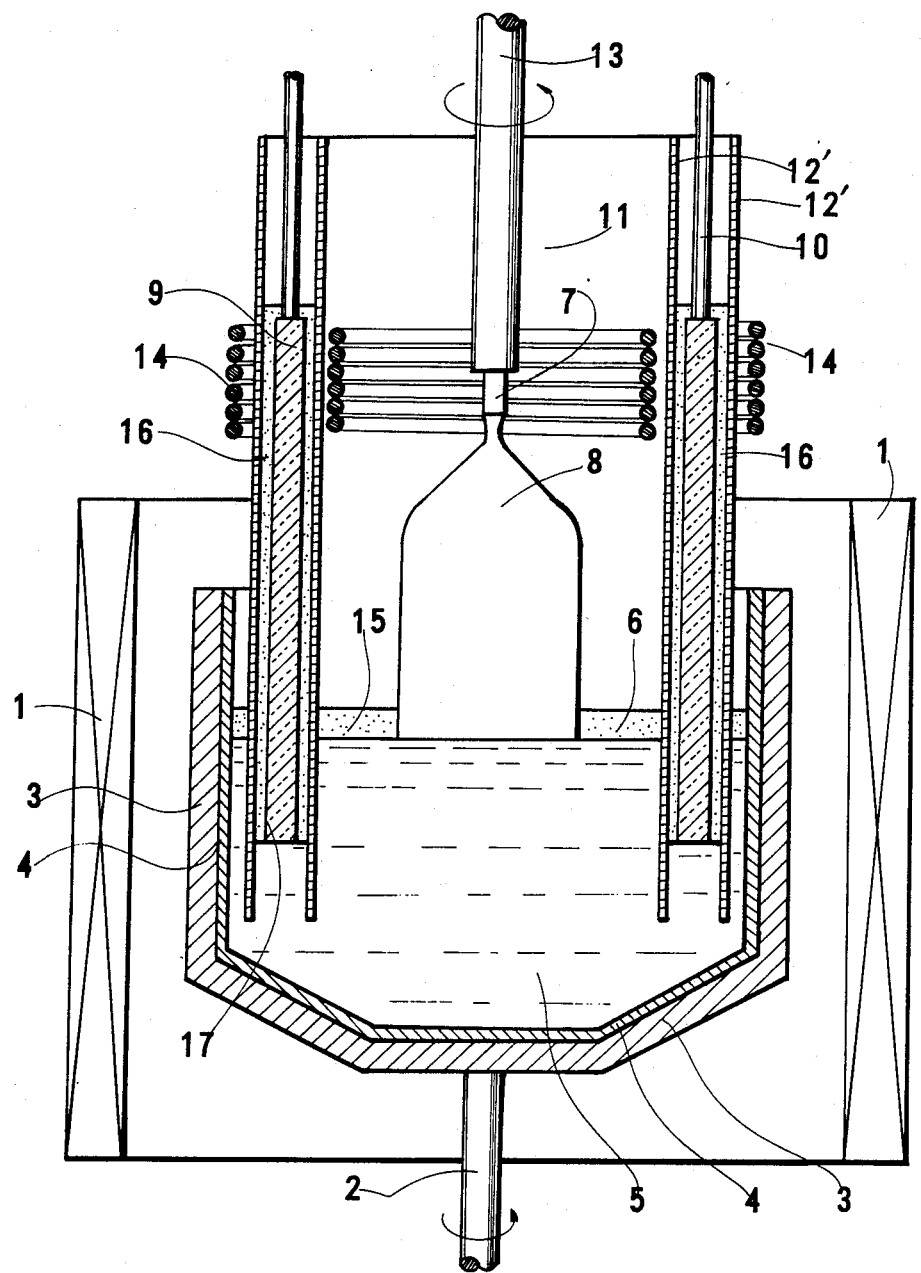
FIG. 2 is a sectional view of an LEC apparatus for growing a single crystal of compound semiconductors according to a second embodiment of the invention.

FIG. 2 shows another embodiment of the invention. This embodiment is immune from the perturbation of the non-symmetric disposition of the supplying device.

In this embodiment a non-doped crystal (9) to be replenished is shaped in a large cylinder whose diameter is a little smaller than that of the crucible (4). And the cylinder of the non-doped crystal (9) is enclosed by a double cylinder (12'). In a gap between the double cylinder (12') and the cylindrical non-doped crystal (9) a liquid encapsulant (16) is filled. Then the double cylinder (12') is called an encapsulant-supporting-double-cylinder.

The disposition and the shape of the encapsulant-supporting-double-cylinder (12') has a perfect rotational symmetry. The existence of the cylinder (12') does not disturb the rotation of the melt (5). No perturbation would occur on the liquid-solid interface (15).

In this case an encapsulant-heater (14) is a double coiled heater installed at a pertinent height of the double cylinder (12'). An alternative of an encapsulant-heater (14) is an assembly of several small heaters which are disposed with several fold symmetry. And two or three identical supporting shafts (10) should be installed.

Now we consider the height of the liquid encapsulant (16) for covering the undoped crystal (9).

What is important is a height H which is defined as a distance from the surface of the lower liquid encapsulant (6) to the surface of the upper liquid encapsulant (16).

"h" denotes a distance from the liquid-solid interface (15) to the bottom end of the encapsulant-supporting-cylinder (12) or double cylinder (12').

"$h_1$" denotes a distance from the normal liquid-solid interface (15) to the suppressed liquid-solid interface (17) in the encapsulant-supporting-cylinder (12) or double cylinder (12').

"$\rho_0$" is a density of the compound melt (5). "$\rho_1$" is a density of the liquid encapsulant (6) or (16). The height H is a function of the interface difference $h_1$. Simple calculations lead to $$H=(\rho_0/\rho_1-1)h_1 \quad (13)$$

It is desirable that H is higher, because the greater part of the undoped crystal (9) is covered with the liquid encapsulant (16).

The height H is in proportion to $h_1$ from Eq.(13). The suppressed liquid-solid interface (17) is kept by the encapsulant-supporting-cylinder (12) or double cylinder (12'). Thus the maximum of the variable $h_1$ is equal to h. Then the maximum of the height H is obtained from Eq.(13) by replacing $h_1$ by h.

Accordingly it is important that the bottom end of the encapsulant-supporting-cylinder (12) or double cylinder (12') is dipped deep into the compound melt (5) and much encapsulant material is filled in the cylinder (12) or double cylinder (12').

In the case of the crystal growth of GaAs the density $\rho_0$ of the melt is 5.7 g/cm$^3$ and the density $\rho_1$ of liquid B$_2$O$_3$ is 1.6 g/cm$^3$. The ratio of H to $h_1$ is about 2.6.

Advantages of this invention are now explained.

(1) The impurity concentration of a single crystal grown by the invention is uniform from seed end to tail end.

This is because the impurity concentration of the melt is kept to be constant by replenishing an undoped polycrystal or single crystal into the melt.

(2) The separating of impurity near the tail end of a crystal does not occur, because the impurity concentration is uniform in the grown crystal. Therefore whole of a crystal is available for making various electronic devices. Waste portion of the crystal is very little.

(3) There happens no deviation from stoichiometry of compounds of groups III-V or groups II-VI.

Heated portion of an undoped crystal to be replenished is covered with a liquid encapsulant which is pressed by N$_2$ gas or inert gas with a high pressure. Volatile elements of group V do not escape from the undoped crystal.

This invention has a wide scope of applicability. This is fully applicable for all kinds of crystal growth by an LEC method. The examples of the matrix crystals are GaAs, GaP, InP, InAs, GaSb, PbTe, PbSe, etc.

Impurities doped into the matrix compound are one or more than one elements among S, B, Te, Sn, Sb, In, Si, Cr, Fe, As, and so on which have a distribution coefficient less than 1 in the matrix compound melt.

What we claim is:

1. An LEC method for growing a single crystal of compound semiconductors comprising the steps of:
   melting a liquid encapsulant material and a compound semiconductor material doped with an impurity with a distribution coefficient of less than 1 to form a compound melt covered by molten liquid encapsulant,
   dipping a seed crystal into the compound melt,
   growing a single crystal from the compound melt by pulling up and rotating the seed crystal; while
   supplying a solid undoped polycrystal or single crystal of the compound semiconductor material covered with a liquid encapsulant to the compound melt at a rate to maintain the impurity concentration in the compound melt at a substantially constant value.

2. An LEC Method as claimed in claim 1, wherein a weight (dQ/dt) of the undoped crystal supplied per unit time and a weight (dS/dt) of the single crystal grown per unit time satisfy the equation:

$$dQ/dt=(1-k)dS/dt$$

where k is a distribution coefficient of the impurity in the compound melt.

3. An LEC method as claimed in claim 1, wherein the compound semiconductor material is one of the compounds of groups III-V.

4. An LEC method as claimed in claim 1 wherein the compound semiconductor material is one of the compounds of groups II-VI.

5. An LEC method as claimed in claim 3, wherein the compound semiconductor material is GaAs and the impurity whose concentration should be kept constant is selected from the group consisting of S, Te, Sn, Si, Cr, Fe, In, Sb, and B.

6. An LEC method as claimed in claim 3, wherein the compound semiconductor material is InP and the impurity whose concentration should be kept constant is selected from the group consisting of Sn, Te, S, As, and Sb.

7. An LEC method as claimed in claim 1, wherein the supplying step comprises the step of supplying a pillared crystal enclosed by an encapsulant-supporting-cylinder, a relative ascending velocity U* of the single crystal and relative descending velocity V* of the undoped crystal satisfy the equation:

$$F^2 V^* = (1-k)E^2 U^* \qquad (5)$$

where F is a radius of the undoped crystal and E is a radius of the grown crystal.

8. An LEC method as claimed in claim 1, wherein an ascending velocity U of the single crystal, an ascending velocity W of the crucible and a descending velocity V of the undoped single crystal satisfy the relation:

$$\frac{CV - (1-k)BU}{C + (1-k)B} = -\frac{AW - kBU}{A - kB} \qquad (11)$$

where A is an area of a liquid-solid interface, B is a sectional area of the grown single crystal, and C is a sectional area of the undoped crystal to be replenished.

9. An LEC method for growing a single crystal of compound semiconductors comprising the steps of:
melting a liquid encapsulant material and a compound semiconductor material doped with an impurity with a distribution coefficient of less than 1 to form a compound melt covered by molten liquid encapsulant,
dipping a bottom end of a solid undoped polycrystal or single crystal of the compound semiconductor material into the compound melt, the solid undoped polycrystal or single crystal being supported by at least one supplying shaft and enclosed by an encapsulant-supporting cylinder with a liquid encapsulant material therein,
melting the liquid encapsulant material in the encapsulant-supporting cylinder by an encapsulant heater surrounding the encapsulant-supporting cylinder,
dipping a seed crystal into the compound melt covered by the molten liquid encapsulant,
growing a single crystal from the compound melt by pulling up and rotating the seed crystal; while
supplying the solid undoped polycrystal or single crystal of the compound semiconductor material covered with the liquid encapsulant in the encapsulant-supporting cylinder to the compound melt by lowering the supplying shaft at a rate to maintain the impurity concentration in the compound melt at a substantially constant value.

* * * * *